United States Patent
Gibbs et al.

(10) Patent No.: US 10,333,182 B2
(45) Date of Patent: Jun. 25, 2019

(54) ESTIMATION OF CELL VOLTAGE EXCURSION IN THE PRESENCE OF BATTERY PACK SENSING FAULTS

(71) Applicant: GM GLOBAL TECHNOLOGY OPERATIONS LLC, Detroit, MI (US)

(72) Inventors: James C. Gibbs, Brighton, MI (US); Todd W. Bazzett, Hartland, MI (US); Andrew C. Baughman, Northville, MI (US); Todd F. Mackintosh, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 365 days.

(21) Appl. No.: 15/219,463

(22) Filed: Jul. 26, 2016

(65) Prior Publication Data

US 2018/0034113 A1    Feb. 1, 2018

(51) Int. Cl.

| | |
|---|---|
| *H01M 10/48* | (2006.01) |
| *H01M 10/46* | (2006.01) |
| *H01M 10/42* | (2006.01) |
| *H01M 10/0525* | (2010.01) |
| *B60L 11/18* | (2006.01) |
| *G01R 31/36* | (2019.01) |
| *B60L 53/24* | (2019.01) |
| *B60L 58/12* | (2019.01) |
| *B60L 58/22* | (2019.01) |
| *G01R 31/396* | (2019.01) |

(52) U.S. Cl.
CPC ........... *H01M 10/482* (2013.01); *B60L 53/24* (2019.02); *B60L 58/12* (2019.02); *B60L 58/22* (2019.02); *G01R 31/396* (2019.01); *H01M 10/0525* (2013.01); *H01M 10/425* (2013.01); *H01M 10/46* (2013.01); *H01M 2010/4271* (2013.01); *H01M 2010/4278* (2013.01); *H01M 2220/20* (2013.01)

(58) Field of Classification Search
CPC .............. G01R 31/3658; G01R 31/362; G01R 31/3606; G01R 31/3624; G01R 31/3679
USPC ......................................................... 324/434
See application file for complete search history.

(56) References Cited

U.S. PATENT DOCUMENTS

| | | | | |
|---|---|---|---|---|
| 5,705,929 | A * | 1/1998 | Caravello .......... | G01R 31/3648 324/430 |
| 6,031,354 | A * | 2/2000 | Wiley ................ | G01R 31/3648 320/116 |

(Continued)

*Primary Examiner* — Christopher P McAndrew
(74) *Attorney, Agent, or Firm* — Quinn IP Law

(57) ABSTRACT

A method and system are disclosed for estimating cell voltage excursion in a battery pack in the presence of a sensing fault in which actual cell voltages of first and second battery cells in a block of battery cells become unknown or missing. The sensing fault is detected, and a cell voltage is determined for each cell in the block other than the first and second cells. The method also includes measuring a block voltage, calculating an average cell voltage in the block, and estimating that the first cell is equal to the calculated average cell voltage. All excursion or deviation of the measured block voltage from a sum of the cell voltages and the estimated cell voltage of the first cell is assigned to the second cell. A control action is executed using the estimated cell voltages, including selectively enabling or disabling functionality of the battery pack.

16 Claims, 2 Drawing Sheets

(56) References Cited

U.S. PATENT DOCUMENTS

| | | | |
|---|---|---|---|
| 2002/0082765 A1* | 6/2002 | Schoch | F02N 11/0862 701/113 |
| 2004/0119441 A1* | 6/2004 | Koo | B60K 6/46 320/104 |
| 2006/0273802 A1* | 12/2006 | Murakami | G01R 31/3835 324/434 |
| 2008/0303527 A1* | 12/2008 | Fechalos | G01R 31/382 324/426 |
| 2009/0027006 A1* | 1/2009 | Vezzini | H02J 7/0014 320/118 |
| 2010/0052615 A1* | 3/2010 | Loncarevic | H02J 7/0016 320/118 |
| 2010/0060295 A1* | 3/2010 | Ishikawa | G01R 31/3842 324/601 |
| 2012/0004873 A1* | 1/2012 | Li | B60L 3/0046 702/63 |
| 2013/0300342 A1* | 11/2013 | de Arroyabe | H01M 10/4207 320/116 |
| 2014/0097787 A1* | 4/2014 | Lin | H02J 7/0018 320/103 |

\* cited by examiner

ESTIMATION OF CELL VOLTAGE EXCURSION IN THE PRESENCE OF BATTERY PACK SENSING FAULTS

TECHNICAL FIELD

The present disclosure relates to the estimation of cell voltage excursion in the presence of sensing faults in a battery pack.

BACKGROUND

Electrical energy from a multi-cell battery pack is used to energize an electric machine in a variety of systems. For instance, in a vehicle having an electrified powertrain, stator windings of an electric machine may be energized by a battery pack to generate output torque. The generated output torque can be delivered to one or more drive axles to propel the vehicle, e.g., a road vehicle, train, or boat. In other systems, such as power plants, construction equipment, robots, certain appliances, and other types of vehicles such as aircraft, motor torque can be used to perform a host of useful work tasks.

A particular type of battery pack uses a reinforced separator positioned within an electrolyte solution between an anode and a cathode, all of which is contained within a polymer-coated aluminum pouch. Tabular extensions of the anode and cathode are ultrasonically welded or otherwise conductively joined to a conductive interconnect member to construct a module of the battery pack. Multiple modules of the same or a different number of battery cells may be electrically interconnected to construct the battery pack, with the actual number of such modules varying with the power requirements of the particular application.

Individual battery cells tend to slowly degrade over time. As a result, electrical parameters such as open circuit voltage, cell resistance, and state of charge may change over time relative to calibrated/new values. In order to ensure accurate ongoing monitoring of the health and available charge of the battery pack, individual cell voltages are typically measured and reported to a battery controller. The measured cell voltages are thereafter used to perform a variety of different battery circuit diagnostics and electric range calculations. As a result, a sensing fault in which the cell voltages become unavailable can result in the controller being temporarily unaware of the true state of the battery pack.

SUMMARY

A method is disclosed for estimating cell voltage deviation or excursion in the presence of a cell sensing fault within a vehicle or other electrified system having a multi-cell battery pack. The particular control problem addressed herein is, due to certain cell sensing faults in which cell voltages are unable to be read for two battery cells in a predetermined block of such battery cells, a controller is unable to accurately monitor the cell voltages in the block for voltage excursion or deviation corresponding, e.g., to an over-charge or under-charge condition. The cells having unavailable or missing voltage data are referred to herein as "missing cells" for simplicity, with the cells having known cell voltage data referred to as "known cells". Such a missing cell condition may result from a broken or disconnected electrical lead between an electrical sensor and one or more of the battery cells. Such leads may be separate or shared, with both hardware configurations described and addressed herein.

Default control actions are conventionally executed in the response to such missing cells. Such control actions include disabling use of the battery pack for its intended purpose, e.g., to start and/or propel a vehicle. However, depending on the particular system in which the battery pack is being used, this may be inconvenient to the operator of the system. By using the present approach to estimate cell voltage excursion, limited functionality of the battery pack may be selectively enabled, such as by using estimated cell voltages for the missing cells to enable use of the battery pack over a limited number of discrete events, e.g., vehicle key cycles, which in turn can provide necessary time to service the battery pack.

Due to the nature of the hardware used in sensing circuits of some electrical systems, a single circuit fault to a shared electrical lead can result in the unavailability of cell voltage readings for two adjacent battery cells. Even when electrical leads are not shared by adjacent cells, two such failures may occur anywhere within the block of battery cells being evaluated. With two unknowns, however, mathematical derivation of the missing cell voltages is not possible. However, it is recognized herein that detailed knowledge of cell voltages for each and every battery cell in a given block of cells is not always required. For instance, the controller may only be required to know whether or not a given battery cell is over-charged or under-charged relative to a threshold. The present approach is intended to enable the controller, when faced with two unknown cell voltages in a given block, to furnish estimated values for the missing cell voltages in order to selectively provide limited functionality of the battery pack as set forth below.

In a particular embodiment, a method is disclosed for estimating or treating cell voltage excursion in a battery pack during a sensing fault. The sensing fault considered herein is any fault in which actual cell voltages of a first and second battery cell in a designated block of battery cells of the battery pack, e.g., a block of eight or ten such cells, becomes unknown or missing. The method may include detecting the sensing fault and then determining a respective cell voltage for each known battery cell in the block of battery cells, i.e., all cells other than the missing first and second battery cells. The method also includes measuring a block voltage as a voltage level across the block of battery cells and then calculating an average cell voltage of the known battery cells in the block.

Additionally, the method includes recording a cell voltage for the first battery cell as a voltage level that is equal to the calculated average cell voltage for the known cells in the block, and then recording that the cell voltage for the second battery cell is the total deviation or excursion of the measured block voltage from a sum of the cell voltages for the known cells and the recorded/estimated cell voltage of the first battery cell. Thereafter, the method includes executing a control action with respect to the battery pack during the detected sensing fault using the recorded cell voltages for the second battery cell, including selectively enabling or disabling functionality of the battery pack.

Detecting the sensing fault may include measuring an electrical resistance within the block and determining whether an open-circuit condition is present.

The method may include predicting an over-voltage or an under-voltage condition of the second battery cell using the recorded cell voltage of the second battery cell, and then selectively disabling functionality of the battery pack via the controller in response to the over-voltage or under-voltage condition. The control action may include selectively enabling limited functionality of the battery pack using the recorded cell voltage of the second battery cell when the over-voltage or under-voltage condition is not present.

The battery pack may be part of a vehicle. In such a configuration, selectively enabling limited functionality of the battery pack may include allowing a predetermined number of key cycles of the vehicle to occur, and then disabling the battery pack, e.g., via a commanded opening of a contactor or other switch. Some embodiments of the method may include displaying, via a display screen, a number of the key cycles remaining before disabling of the battery pack will occur.

A system is also disclosed that includes a controller, the battery pack, a first sensor operable for measuring a cell voltage for each of the battery cells, a second sensor operable for measuring a block voltage as a voltage level across a designated block of the battery cells, and a third sensor operable for detecting a sensing fault in which actual cell voltages of a first and second battery cell in the designated block of the battery cells become unknown or missing. The controller is programmed to execute the method noted above.

The above summary is not intended to represent every embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present disclosure when taken in connection with the accompanying drawings and the appended claims.

DETAILED DESCRIPTION

Figure 1:
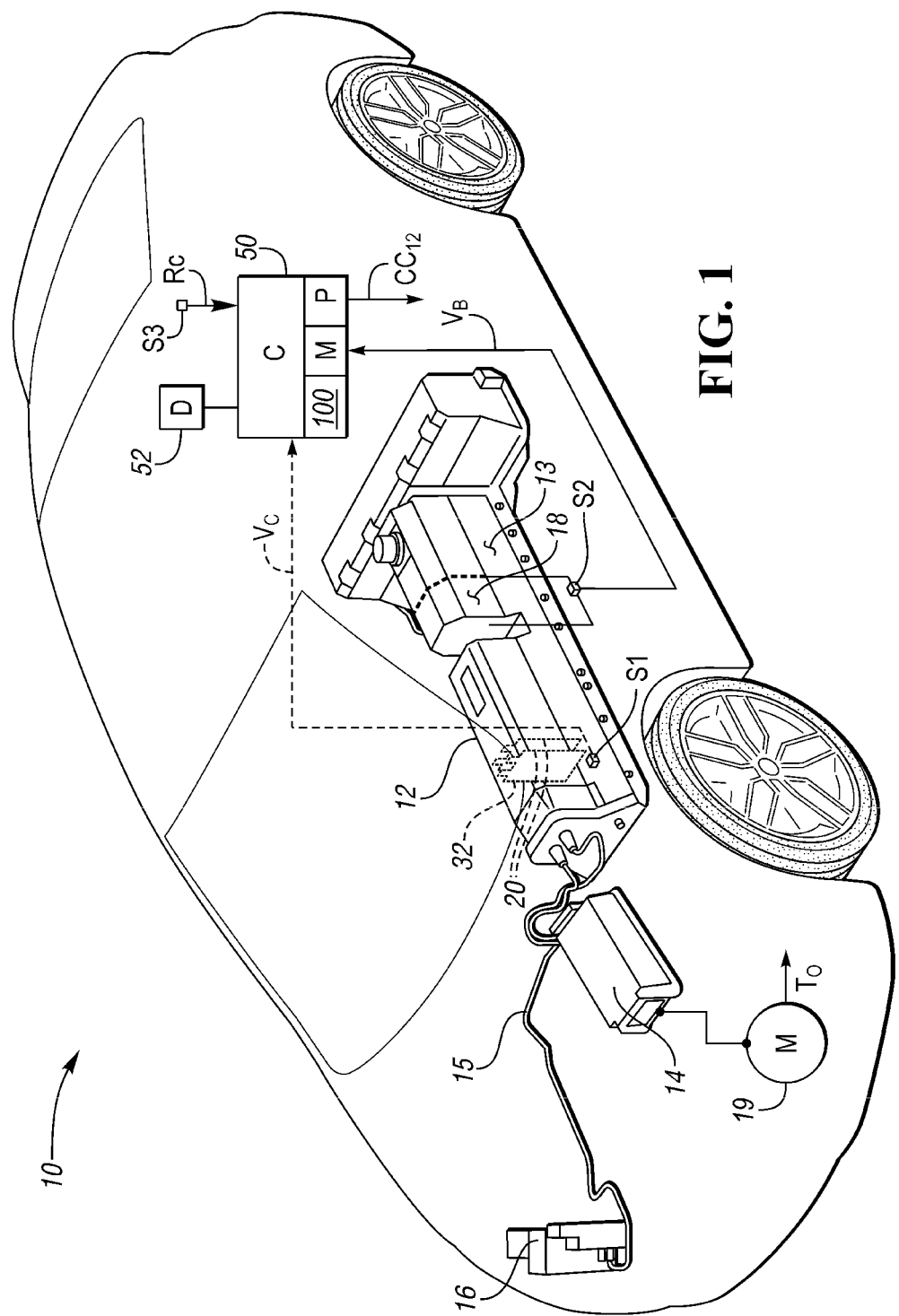
FIG. 1 is a schematic illustration of an example vehicle having a multi-cell battery pack and a controller programmed to estimate cell voltage excursion and provide limited operation to the vehicle in the presence of battery sensing faults.

Referring to the drawings, wherein like reference numbers refer to like components throughout the several views, an example system 10 is shown in FIG. 1 having a high-voltage direct current (DC) battery pack 12. The battery pack 12 includes a plurality of battery cells 20, only two of which are shown in FIG. 1 for illustrative simplicity. Each battery cell 20 includes electrodes 32, with the various electrodes 32 ultrasonically welded or otherwise conductively joined together via a conductive interconnect member (not shown) so as to form the battery pack 12, as is well known in the art.

The battery pack 12 may be configured as a rechargeable lithium-ion battery pack in a typical non-limiting example embodiment. The battery pack 12 includes a housing 13, e.g., a T-shaped housing as shown. One possible configuration of the battery pack 12 includes at least 192 of the battery cells 20 collectively outputting at least 18 kWh of electrical power, although the battery pack 12 is not limited to such an embodiment. Other embodiments of the battery pack 12 may have different shapes, power ratings, and/or active materials other than lithium ion-based chemistries, and therefore the T-shaped configuration of FIG. 1 is exemplary and non-limiting. The battery pack 12 may be divided into groups or blocks 18 having a predetermined number of the battery cells 20, e.g., 8-10 of the battery cells 20 per block 18 in a possible non-limiting embodiment.

The system 10 may be configured as any mobile or a stationary system of any type that may benefit from the use of electrical energy stored in the various battery cells 20. Examples of the system 10 may include a vehicle as shown, e.g., an extended-range electric vehicle, a plug-in hybrid electric vehicle, a battery electric vehicle, or another mobile platform, robot, or stationary/non-vehicular system such as a power plant. The system 10 may further include an electric machine (M) 19 in the form of a traction motor and/or a motor/generator unit that is powered by electrical energy from the battery pack 12 to generate output torque (arrow $T_O$). Additionally, the system 10 may include a power inverter module 14 that, in some embodiments, is electrically connected to a charging module 16 via high voltage cables 15. The power inverter module 14 may receive alternating current (AC) power from the charging module 16 when the charging module 16 is plugged into an available AC charging outlet (not shown). The power inverter module 14 may use pulse-width modulation or other power switching techniques to transform the AC voltage from the charging module 16 into a DC voltage suitable for charging the various battery cells 20, as is well known in the art.

The system 10 of FIG. 1 may also include a controller (C) 50 programmed to estimate cell voltages of the various battery cells 20 via a method 100 in the presence of a sensing fault of the type described below. The controller 50 may be embodied as one or more microcontrollers or central processing units (P) and memory (M), e.g., read only memory, random access memory, and electrically-erasable programmable read only memory. The controller 50 may include a display screen (D) 52, a high-speed clock, input/output circuitry, and/or any other circuitry that may be required to perform the functions described herein.

As part of the method 100, the controller 50 receives individual measured cell voltages (arrow $V_C$) for each of the battery cells 20. For instance, one or more first sensors (S1) may be used to determine a respective cell voltage (arrow $V_C$) of each of the battery cells 20, e.g., a voltage sensor or a current sensor, with the latter requiring calculation of the cell voltage (arrow $V_C$) using a cell resistance value, e.g., a modeled or calibrated value. A plurality of the first sensors (S1) may be used that is equal to the number of cells 20, such that a respective first sensor (S1) can be used to measure a voltage or current of a corresponding one of the cells 20. Alternatively, a single first sensor (S1) may be multiplexed to the various cells 20 so as to measure all of the cell voltages or currents of the various cells 20 in the block 18.

The system 10 may include a second sensor (S2) operable for measuring a block voltage ($V_B$) as a voltage level across the block 18 as a whole, and for outputting the measured block voltage ($V_B$) to the controller 50 as shown via arrow $V_B$ in FIG. 1. Also as shown in FIG. 1, the controller 50 is programmed to output a control signal (arrow $CC_{12}$) to the battery pack 12 or a powertrain using the battery pack 12 to selectively execute a control action with respect to the battery pack 12 or powertrain, doing so in accordance with the method 100, an embodiment of which will now be described with reference to FIG. 3. A third sensor (S3) may be used to measure cell resistance ($R_C$) or other suitable values to detect the sensing fault, e.g., by measuring an electrical resistance within the block 18 as is known in the art and then determining whether an open-circuit condition is present indicative of the broken or disconnected electrical leads 25 or 26 of FIGS. 2A-B.

Figure 2A:
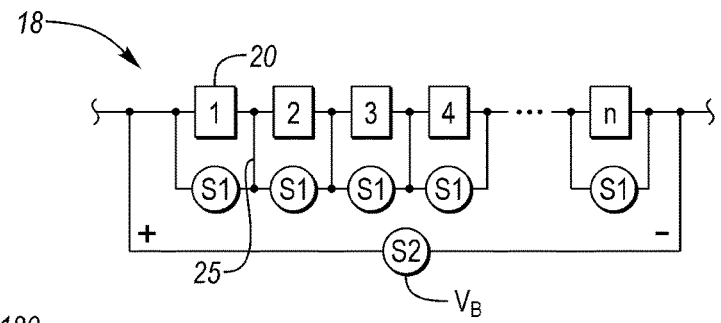
FIG. 2A is a schematic circuit diagram describing an example block of battery cells in which adjacent cells share an electrical lead.

Referring to FIG. 2A, the block 18 of battery cells 20 is shown schematically to include a plurality (n) of the battery cells 20, with the value of the integer (n) depending on the embodiment. For example, the block 18 may include eight or ten cells 20, such that n=8 or n=10. For simplicity, the cells 20 are numbered sequentially as 1, 2, 3, 4, . . . , n. Additionally, in the illustrated embodiment the first sensors (S1) are arranged such that each cell 20 has a corresponding first sensor (S1). A single second sensor (S2) is used to measure the block voltage ($V_B$).

In the embodiment of FIG. 2A, adjacent cells 20 in the block 18 share an electrical lead 25. In such an embodiment, the controller 50 may take a differential reading to determine the respective cell voltages $V_C$ of adjacent cells 20. However, a sensing fault in which the shared electrical lead 25 breaks or becomes disconnected will result in missing cell voltages ($V_C$) for the two adjacent cells 20. For instance, if the electrical lead 25 shared by the cells 20 numbered 2 and 3 in FIG. 2A becomes disconnected, the controller 50 will not be able to determine the cell voltages $V_C$ for those two cells 20. With two unknown voltages, the controller 50 cannot calculate the missing voltages, and thus resorts to execution of the method 100 to estimate cell voltages for use and determine whether cell voltage excursion is present.

Figure 2B:
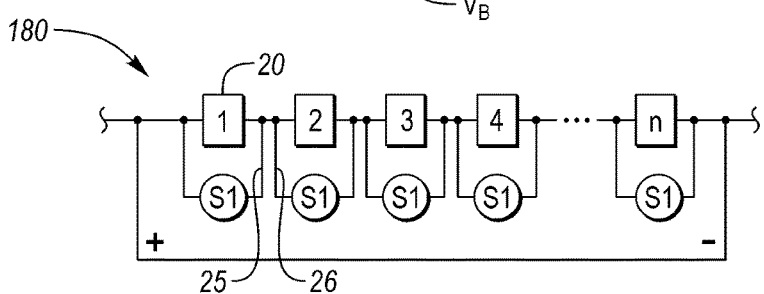
FIG. 2B is a schematic circuit diagram describing an example block of battery cells having individual leads.

Similarly, block 180 of FIG. 2B may be envisioned in which the electrical leads 25 of FIG. 2A are not shared between adjacent cells 20. Instead, the electrical leads 25 and 26 are kept separate, i.e., each sensor (S1) has its own such leads. A failure of any one lead 25 or 26 in this particular instance will therefore not result in two unknowns, and therefore the controller 50 can simply calculate the missing voltage as a function of the block voltage $V_B$ and the other measured cells voltages $V_C$. However, in the event two such electrical leads 25 and 26 should ever become disconnected, the controller 50 could use the method 100 to estimate the two unknown voltages in the block 18 and enable limited functionality of the system 10.

Figure 3:
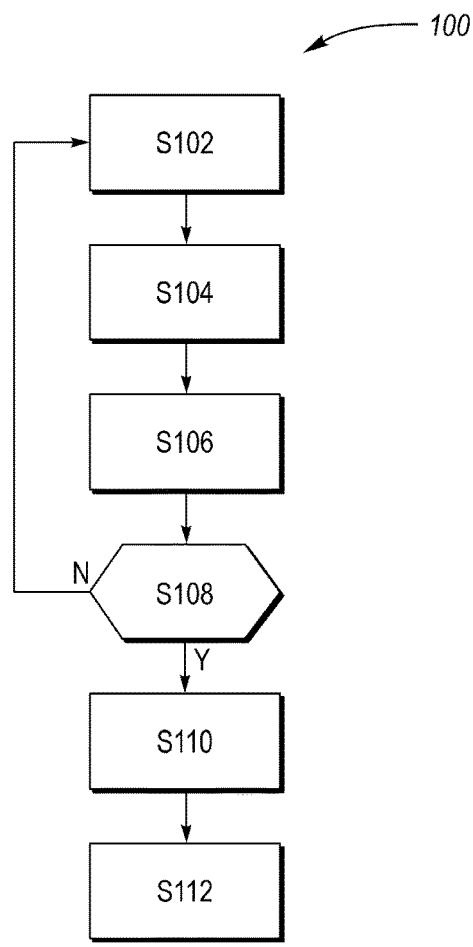
FIG. 3 is a flow chart describing an example method of estimating cell voltage excursion in the presence of battery sensing faults aboard the vehicle shown in FIG. 1.

Referring to FIG. 3, in an example embodiment the method 100 begins with step S102, wherein the controller 50 of FIG. 1 detects a cell sensing fault in a given block 18 of battery cells 20. The number of cells 20 in the block 18 may be designated in memory (M) of the controller 50, and may or may not correspond to the number of cells 20 used in a given battery module. For instance, the controller 50 may consider blocks 18 or eight or ten cells 20 as being a block 18.

As is known in the art, the controller 50 may measure or otherwise determine the electrical resistance of the various cells 20 within the block 18 and then look for a high resistance value relative to a calibrated threshold, with a high resistance value being indicative of the presence of an open-circuit condition, i.e., a broken or disconnected electrical lead 25 or 26. The method 100 proceeds to step S104 when the cell sensing fault has been detected.

At step S104, the controller 50 determines the respective cell voltages (arrow $V_C$) for each of the known battery cells 20 in the block 18 as measured by the first sensor(s) (S1). Step S104 may entail transmission of the cell voltages (arrow $V_C$) by the first sensor(s) (S1), e.g., via a controller area network (CAN) bus or low-voltage wiring, to the controller 50. The method 100 then proceeds to step S106.

Step S106 includes measuring or otherwise determining the block voltage (arrow $V_B$) as a voltage level across the block 18 of battery cells 20, e.g., via the second sensor (S2). The method 100 then proceeds to step S108.

At step S108, the controller 50 calculates an average cell voltage ($V_{AVG}$) for the known battery cells 20 in the block 18, i.e., those cells 20 whose individual cell voltages ($V_C$) are measured and thus known. For instance, if block 18 includes eight battery cells 20, two of which are missing or unknown, the controller 50 calculates an average voltage ($V_{AVG}$) for the six (6) known battery cells 20, i.e., V1, V2, . . . V6, as $$\frac{V1 + V2 + \ldots V6}{6}.$$

The method 100 then proceeds to step S110.

At step S110, the controller 50 records an estimated cell voltage for a first of the two missing battery cells 20. To do this, the controller 50 records in memory (M) an estimated cell voltage that is equal to the calculated average cell voltage ($V_{AVG}$) for the known battery cells 20 from step S108, i.e., the cells 20 other than the two cells 20 whose values are missing or unknown. The controller 50 also records an estimated cell voltage for the second missing cell 20 by assigning any excursion or deviation of the measured block voltage (arrow $V_B$), a value that is known from step S106, from the sum of the measured (known) cell voltages (arrow $V_C$) and the recorded estimated voltage for the first missing cell 20. For example, in a simplified illustration each of six known individual battery cells 20 may have measurements of 1 VDC. The average of these known cells 20, i.e., $V_{AVG}$, is thus 6 VDC/6=1 VDC. The controller 50 of FIG. 1 assumes that the first missing cell 20 also has a cell voltage of 1 VDC as part of the method 100.

With respect to the second missing cell 20, the controller 50 assigns all excursion or deviation of the measured block voltage $V_B$ from the sum of the known cell voltages (arrow $V_C$) and the assigned first voltage. Since the sum is 7 VDC in this simplified example, and assuming for the purposes of the example that the block voltage ($V_B$) is 8.5 VDC, the controller 50 takes the deviation of 8.5 VDC−7 VDC=1.5 VDC and assigns this value to the second missing cell 20. Thus, the battery cells 20 labeled as 1-6 are known in this example to be at 1 VDC, the first missing cell 20 is estimated to be the average of these values, i.e., 1 VDC, and the second missing cell 20 is estimated to be at the value of the excursion, i.e., 1.5 VDC. The controller 50 records the two estimated values and the measured values in its memory (M) and proceeds to step S112.

Step S112 includes executing a control action with respect to the battery pack 12 of FIG. 1 using the estimated cell voltage for the second missing cell 20, i.e., using the estimated voltage excursion. For instance, the controller 50 may execute an algorithm (not shown) to determine an over-voltage or under-voltage condition of the cells 20 using the measured and estimated values, e.g., by comparing the cell voltages to a calibrated upper and lower threshold indicative of respective over-voltage and under-voltage conditions, as is known in the art.

The controller 50 may selectively enable or disable functionality of the battery pack 12 using the recorded estimates of cell voltages of the first and second missing battery cells 20. For instance, the controller 50 may start a timer or a counter to initiate limited functionality of the battery pack 12. Doing so allows sufficient time for servicing any disconnected or broken electrical leads 25 or 26 causing the sensing fault, rather than immediately disabling the battery pack 12 in the typical manner. The control action may include selectively enabling limited functionality of the battery pack 12 using the estimated cell voltages when an over-voltage or under-voltage condition is not present.

In some embodiments, the controller 50 may display a message on the display screen 52 of FIG. 1 warning an operator of the system 10 of a remaining of number key cycles before the battery pack 12 and system 10 are disabled. In an example configuration, the controller 50 may be programmed with a predetermined number of key cycles, e.g., 10 key cycles, and may display a warning to an operator of the system 10 that a fault has been detected that requires service, and that the system 10 will be disabled after the predetermined number of key cycles. The number of key cycles may count down with each successive key cycle to keep the operator informed as to the impending need for service. If such service is not completed, this will eventually result in the controller 50 automatically disabling functionality of the battery pack 12, e.g., via a commanded opening of high-voltage contactors (not shown) to disconnect the battery pack 12 from a high-voltage DC bus.

Using the method 100 disclosed above, the controller 50 is able to assign all deviation from average, i.e., voltage excursion, to a given missing cell 20. This requires the controller 50 to assume that the cell voltage ($V_C$) for that particular cell 20 is higher or lower than it actually is, potentially affecting charging function or drive operations. However, the control action of limiting operation to a finite number of key cycles or other discrete events, e.g., 10 key cycles, or to a particular window of time, is intended as a tradeoff between such effects and the inconvenience caused by an immediate disabling of the system 10. Continuous operation in a propulsion state is provided rather than defaulting to a no-start or other disabled condition, with optional visual feedback to the operator to urge the operator to service the system 10.

Additionally, those of ordinary skill in the art will appreciate that the present approach may also be used for blocks 18 in which the sensing fault includes a cell 20 that is an end cell. In such a condition, the block voltage ($V_B$) will be unavailable. Therefore, the controller 50 may consider an adjacent group of battery cells 20 and treat the combined cells 20 as one block 18, executing the method 100 for a larger number of battery cells 20.

While the best modes for carrying out the disclosure have been described in detail, those familiar with the art to which this disclosure relates will recognize various alternative designs and embodiments for practicing the disclosure within the scope of the appended claims.

The invention claimed is:

1. A method for estimating cell voltage excursion in a battery pack in the presence of a sensing fault during which measured cell voltages of a first battery cell and a second battery cell in a designated block of battery cells of the battery pack become unknown or missing, the method comprising:

detecting the sensing fault based on a measured electrical resistance within the designated block of battery cells, including determining whether an open-circuit condition is present in the designated block of battery cells, wherein the open-circuit condition is indicative of the measured cell voltages of the first battery cell and the second battery cell being unknown or missing;

determining, via a controller, a respective cell voltage for each known battery cell in the designated block of battery cells using a first sensor, wherein the known battery cells are all of the battery cells in the block of designated battery cells whose respective cell voltage measurements are known to the controller;

measuring, using a second sensor, a block voltage as a voltage level across the block of battery cells;

calculating, via the controller, an average cell voltage of the known battery cells;

recording a first estimated cell voltage for the first battery cell as being equal to the calculated average cell voltage;

recording a second estimated cell voltage for the second battery cell as being equal to an excursion or deviation of the measured block voltage from a sum of the cell voltages of the known battery cells and the recorded cell voltage of the first battery cell; and executing, via the controller, a control action with respect to the battery pack during the sensing fault using the second estimated cell voltage for the second battery cell, including selectively enabling or disabling functionality of the battery pack;

wherein detecting the sensing fault is performed by a third sensor based on a measured electrical resistance within the designated block of battery cells.

2. The method of claim 1, further comprising: predicting an over-voltage or an under-voltage condition of the second battery cell using the recorded second estimated cell voltage of the second battery cell, and then selectively disabling functionality of the battery pack in response to the over-voltage or under-voltage condition.

3. The method of claim 1, wherein executing the control action includes selectively enabling limited functionality of the battery pack using the recorded second estimated cell voltage of the second battery cell when the over-voltage or under-voltage condition is not present.

4. The method of claim 3, wherein the battery pack is part of a vehicle, and wherein selectively enabling limited functionality of the battery pack includes allowing a predetermined number of key cycles of the vehicle before disabling the battery pack.

5. The method of claim 4, further comprising: displaying, via a display screen, a number of the key cycles remaining before the disabling of the battery pack.

6. The method of claim 1, wherein determining a respective cell voltage of each battery cell in the block includes directly measuring the individual cell voltages using one or more voltage sensors.

7. The method of claim 1, wherein adjacent battery cells in the block share an electrical lead, and wherein detecting the sensing fault includes determining whether the shared electrical lead has broken or become disconnected.

8. The method of claim 1, wherein adjacent battery cells in the block have separate electrical leads, and wherein detecting the sensing fault includes determining whether two of the electrical leads in the block have broken or become disconnected.

9. A system comprising:

a battery pack having a plurality of battery cells;

at least one first sensor operable for measuring a cell voltage for each of the battery cells;

a second sensor operable for measuring a block voltage as a voltage level across a designated block of the battery cells;

a third sensor operable for detecting a sensing fault in which measured cell voltages of a first battery cell and a second battery cell in the designated block of the battery cells become unknown or missing, wherein the third sensor is configured to measure an electrical resistance within the designated block of battery cells, and to determine whether an open-circuit condition is present in the designated block of battery cells indicative of the measured cell voltages of the first battery cell and the second battery cell being unknown or missing; and a controller programmed to:
receive a respective cell voltage measurement from the at least one first sensor for each of the known battery cells in the block of battery cells;
detect the sensing fault using the electrical resistance from the third sensor;
receive the block voltage from the second sensor;
calculate an average cell voltage of the known battery cells;
record a first estimated cell voltage for the first battery cell as being equal to the calculated average cell voltage of the known battery cells;
record a second estimated cell voltage for the second battery cell as all excursion or deviation of the measured block voltage from a sum of the cell voltages for the known battery cells and the recorded cell voltage of the first battery cell; and
execute a control action with respect to the battery pack during the sensing fault using the recorded cell voltage for the second battery cell, including selectively enabling or disabling functionality of the battery pack.

10. The system of claim 9, wherein the controller is programmed to predict an over-voltage or an under-voltage condition of the second cell using the recorded second estimated cell voltage of the second battery cell, and to selectively disable functionality of the battery pack in response to the over-voltage or under-voltage condition.

11. The system of claim 9, wherein the control action includes selectively enabling limited functionality of the battery pack using the recorded second estimated cell voltage of the second battery cell when the over-voltage or under-voltage condition is not present.

12. The system of claim 9, wherein the battery pack is part of a vehicle, and wherein the controller is programmed to selectively enable limited functionality of the battery pack by allowing a predetermined number of key cycles of the vehicle to occur before disabling the battery pack.

13. The system of claim 12, further comprising a display screen, wherein the controller is programmed to display, via the display screen, a number of the key cycles remaining before the disabling of the battery pack.

14. The system of claim 9, the plurality of battery cells including adjacent battery cells, further comprising: an electrical lead shared by the adjacent battery cells.

15. The system of claim 9, the plurality of battery cells including adjacent battery cells, wherein the adjacent battery cells in the block have separate electrical leads.

16. The system of claim 9, further comprising an electric machine that is electrically connected to and energized by the battery pack.

* * * * *